United States Patent [19]

Brackelmanns et al.

[11] Patent Number: 4,460,913

[45] Date of Patent: Jul. 17, 1984

[54] FAST SWITCHING TRANSISTOR

[75] Inventors: Norbert W. Brackelmanns, Ironia; William Hulstrunk, Millburn, both of N.J.

[73] Assignee: RCA Corporation, New York, N.Y.

[21] Appl. No.: 316,660

[22] Filed: Oct. 30, 1981

[51] Int. Cl.³ .................. H01L 29/06; H01L 29/72
[52] U.S. Cl. .................................. 357/34; 357/20; 357/36
[58] Field of Search .................. 357/34, 36, 86, 20

[56] References Cited

U.S. PATENT DOCUMENTS

| | | | |
|---|---|---|---|
| 3,453,503 | 7/1969 | Schulz et al. | 317/235 |
| 4,322,736 | 3/1982 | Sasaki et al. | 357/86 |
| 4,345,266 | 8/1982 | Owyang | 357/34 |

FOREIGN PATENT DOCUMENTS

| | | | |
|---|---|---|---|
| 54-100671 | 8/1979 | Japan | 357/34 |
| 935710 | 9/1963 | United Kingdom | 357/36 |
| 1062146 | 3/1967 | United Kingdom | 357/34 |
| 2026236A | 1/1980 | United Kingdom | |

OTHER PUBLICATIONS

J. B. Gillett, "Power Transistor Having Increased Reverse Bias Safe Operating Area", *IBM Technical Disclosure Bulletin,* vol. 16, (1974), p. 3642.

*Primary Examiner*—J. Carroll
*Attorney, Agent, or Firm*—Birgit E. Morris; Donald S. Cohen; Thomas H. Magee

[57] ABSTRACT

The preferred embodiment of the invention disclosed herein is a transistor that includes a body of semiconductor material having first and second major surfaces. An emitter doped with atoms of one conductivity type is formed in the body and extends into it from the first major surface. The emitter geometry is such that it has hub portion and finger portions. Within the closed area formed by the hub portion of the emitter, there is provided a central region doped with atoms of the same conductivity type as the emitter and this central region is slightly spaced from the inner periphery of the hub portion. Over the central region and the space between it and the inner periphery of the emitter is provided an oxide layer over which electrode metallization is deposited so as to be in contact with the hub portion but spaced from the central region.

6 Claims, 2 Drawing Figures

FAST SWITCHING TRANSISTOR

BACKGROUND OF THE INVENTION

This invention relates to transistors and, more particularly, to bipolar transistors having relatively fast switching speeds.

When a transistor is turned off, the majority carriers in the base flow laterally from beneath the emitter to the base electrode causing a lateral voltage drop that turns off the outer edge portions of the emitter, but leaves the central portion thereof on. That is, the central portion of the emitter still injects minority carriers. Because of this, the transistor becomes harder to turn off. This is due to the fact that the current remains constant for some period of time so that the current density becomes higher and the distance from the base electrode becomes greater. As a result, the turn off time is increased and, in some circumstances, reverse second breakdown occurs.

One attempt to increase the switching speed of transistors has been to use an interdigitated emitter configuration, that is, an emitter having a narrow spine portion from which a plurality of finger portions extend. In an attempt to still further improve the switching speed of transistors, a no gain portion has been formed in the central area of the spine and finger portions. The no gain portion is provided by separating the outer regions of the spine and finger portions intermediate their ends so that the adjacent outer regions of the spine and each finger portion are separated by base material. An insulating material extends over the centrally located base material and emitter contact metallization extends over the insulating material and the outer regions of the spine and finger portions.

It has been found that forming such spine and finger portions is extremely difficult because they are so narrow. Moreover, it has been found that if there are any pinholes in the insulating material or if it fails, a short is formed from the emitter contact metallization to the base. These shorts can render the device inoperative.

SUMMARY OF THE INVENTION

This invention provides a transistor including a no gain emitter portion wherein pinholes or oxide failure do not render the device inoperative. The transistor comprises a body of semiconductor material having first and second major surfaces. An emitter doped with atoms of one conductivity type extends into the body from the first major surface and includes a hub portion having finger portions extending therefrom. The base is doped with atoms of the opposite conductivity type and extends into the body from the first major surface forming a PN junction with the emitter. A collector, doped with atoms of the one conductivity type, extends into the body from the second major surface forming a PN junction with the base. Within the hub portion of the emitter there is a central region doped with atoms of the one conductivity type that extends into the body from the first major surface and this central region is spaced from the hub portion of the emitter. An insulating layer is deposited over the first major surface and covers the central region and the space between this region and the hub portion of the emitter. Electrode means is provided over the insulating layer and extends into contact with the hub portion of the emitter and the finger portions thereof so that an oxide failure over the central region does not short the device.

BRIEF DESCRIPTION OF THE DRAWINGS

For a better understanding of the invention, reference is made to the following description of a preferred embodiment thereof, taken in conjunction with the figures of the accompanying drawing, in which.

DETAILED DESCRIPTION OF A PREFERRED EMBODIMENT

Figure 2:
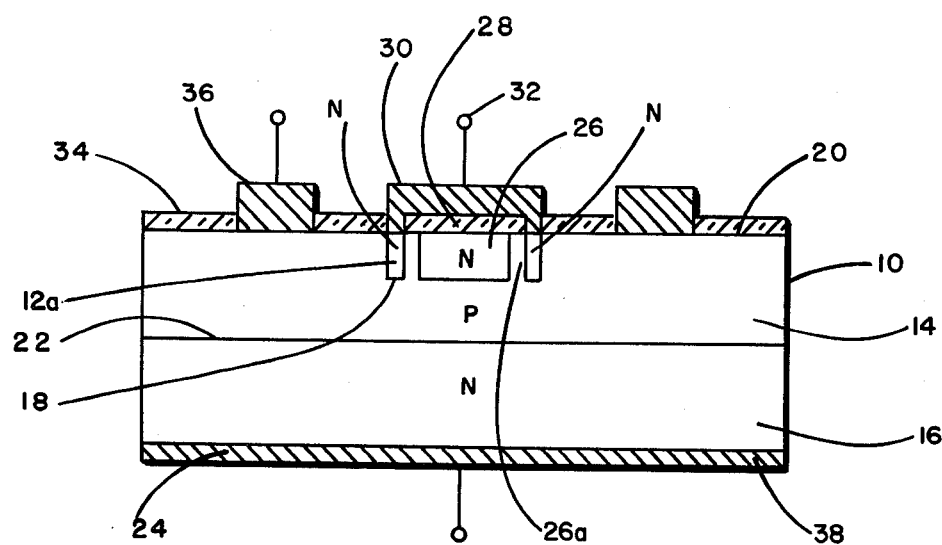
FIG. 2 is a section view taken generally along the line 2—2 of FIG. 1 with the metallization illustrated.

In the drawing there is disclosed an NPN transistor in accordance with this invention. The transistor is formed in a body 10 of semiconductor material such as silicon. Included is an N type emitter 12, a P type base 14 and an N type collector 16. Between the emitter 12 and base 14 is formed a first PN junction 18 including a portion parallel to and slightly spaced from the first, top as viewed in the drawing, surface 20 of body 10 and a portion intersecting that surface. Between the base 14 and the collector 16 is formed a second PN junction 22 generally parallel to and spaced from a second, bottom as viewed in the drawing, surface 24 of the body 10. It should be understood that the transistor could include a conventional mesa structure in which case the junction 18 between the emitter and base would terminate in the side edge of the body 10.

The collector 16, although not illustrated in the drawing, could include a first region of relatively high resistivity material, a second region of lower resistivity material and a third region of lowest resistivity material with the resistivity decreasing from the PN junction 22 to the second surface 24 of the chip. Thus, the lowest resistivity material would extend inwardly from the second major surface 24, and the highest resistivity material would extend toward the second surface from the PN junction 22. This is a generally conventional buffered collector well known in the art.

Figure 1:
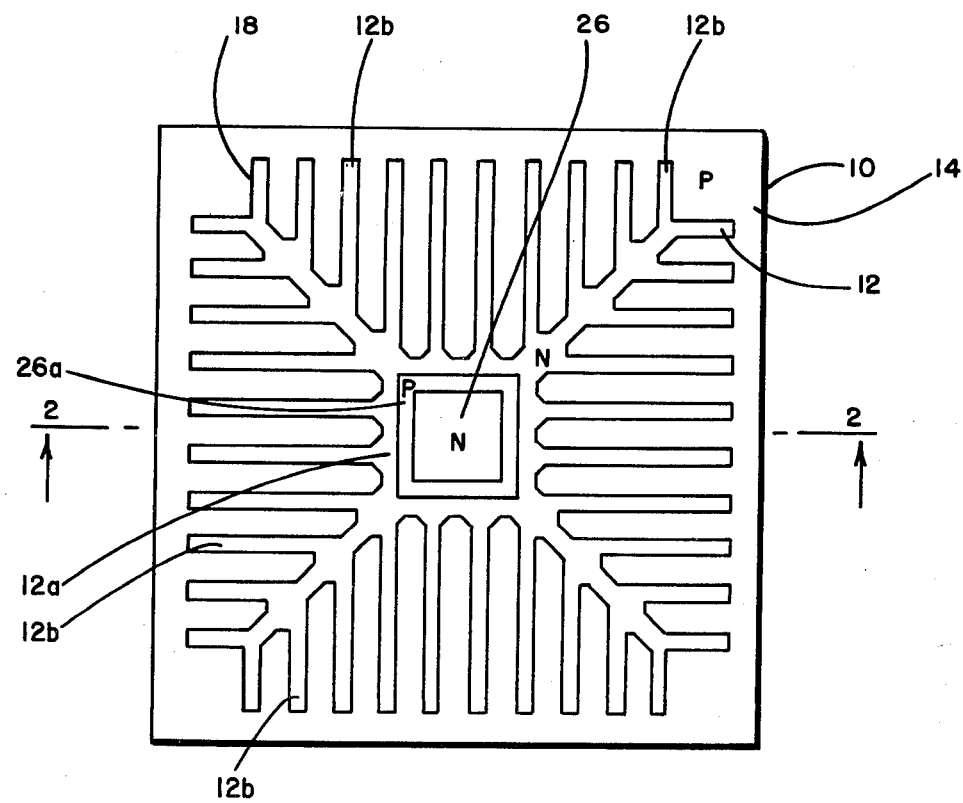
FIG. 1 is a top plan view of a transistor in accordance with this invention prior to metallization.

The geometry of the transistor, that is, its top surface configuration is of the interdigitated type. In accordance with this invention, the emitter 12 includes a hub portion 12a and a plurality of finger portions 12b extending therefrom. The hub portion 12a is part of the emitter bond pad area and, in the embodiment disclosed here, is centrally located on the body 10. As clearly seen in FIG. 1, the hub portion 12a is generally annular in plan view except that it is generally rectangular rather than circular. Thus, the term "annular" as used herein is not restricted to a circular configuration but includes a variety of closed shapes having an inner and outer periphery. The finger portions 12b radiate perpendicularly from the hub portion 12a along its sides and at a bisecting angle at its corners. These angled finger portions are formed with additional finger portions extending therefrom at an angle such that the additional finger portions are generally parallel to those finger portions extending from the sides of the hub portion. Thus, the finger portions 12b are interdigitated with finger portions in the base. This arrangement gives the desired high emitter periphery to area ratio that improves the switching speed of the device. It should be obvious that other interdigitated patterns can be utilized.

A central region 26 of the area inside the hub portion 12a is doped with atoms of the same conductivity type as the emitter, that is, N type atoms. The central region 26 is spaced from the inner periphery of hub portion 12a by a space 26a as small as possible in view of processing constraints. The central region 26 is thus as large as possible but separated from the hub portion 12a by a band 26a of P type material forming part of the base 14. Over this central region 26 and the band 26a between it and the inner periphery of the hub portion 12a is formed an insulating layer 28 such as silicon dioxide (SiO₂). In practice, the insulating layer 28 slightly overlaps the inner periphery of the hub portion 12a to assure that no portion of the band 26a of P type base material is exposed. A metal electrode 30 is formed over the top of the insulating layer 28 and down its sides so that it contacts the hub portion 12a of the emitter. The electrode 30 also contacts the finger portions 12b. Thus, the electrode 30 makes ohmic contact with the emitter 12 and is spaced from the central region 26 by the insulating oxide layer 28. The region of the electrode 30 extending over the top of the central region 26 and the oxide layer 28 serves as a bond pad so that a lead, shown schematically as 32, can be attached.

The surface 20 adjacent the base 14 is also covered with an insulating layer 34 such as silicon dioxide and this layer is formed with openings for electrodes 36 that make ohmic contact to the base. An electrode 38 is deposited over the surface 24 to make ohmic contact to the collector 16. These ohmic contacts or electrodes 36 and 38 are connected to leads in a conventional manner as schematically illustrated in FIG. 2.

The device described above can be made in accordance with conventional manufacturing techniques. For example, the starting wafer can be a heavily doped epitaxially grown wafer into which the base and emitter are diffused. While diffusing the emitter, the central region 26 can be diffused so that no additional manufacturing steps are necessary. Thus the central region 26 extends into the body 10 the same distance as the emitter 12. Operation of the transistor is generally conventional except that the central region 26 does not inject electrons when the transistor is turned on. Thus, the switching speed is improved in that there are no stored minority carriers under this region 26. If pinholes are formed in the oxide layer 28, the emitter electrode 30 does not short to P type material forming the base 14. Rather, metal from the electrode 30 should contact N type material in the central region 26 so that this region operates as an emitter portion. Thus, the transistor is not rendered inoperative, but continues to work although the switching speed may be slightly impaired.

While in the foregoing there has been disclosed a preferred embodiment of the invention, it should be obvious to thos skilled in the art that various changes can be made within the scope of the appended claims.

We claim:

1. A transistor comprising a body of semiconductor material having first and second major surfaces; an emitter doped with atoms of one conductivity type extending into said body from said first major surface; said emitter having a hub portion and finger portions extending therefrom; a base doped with atoms of the opposite conductivity type extending into said body from said first surface and forming a PN junction with said emitter; a collector doped with atoms of said one conductivity type extending into said body from said second surface and forming a PN junction with said base; a central region doped with atoms of said one conductivity type extending into said body from said first major surface, said central region being located within said hub potion of said emitter and being spaced therefrom; an insulating layer on said first major surface, said insulating layer covering said region and the space between said central region and the periphery said hub portion and electrode means covering said insulating layer and contacting said hub portion of said emitter and said finger portions thereof.

2. A transistor in accordance with claim 1 including lead means contacting said electrode means adjacent said insulating layer.

3. A transistor in accordance with claim 1 wherein said central region extends into said body the same distance as said emitter region.

4. A transistor in accordance with claim 1 wherein said space between said hub portion of said emitter and said central region is doped with atoms of the opposite conductivity type.

5. A transistor in accordance with claim 1 including electrode means contacting said base and electrode means contacting said collector.

6. A transistor in accordance with claim 1 wherein said hub portion is generally annular.

* * * * *